(12) United States Patent
Nunokawa et al.

(10) Patent No.: US 7,429,900 B2
(45) Date of Patent: Sep. 30, 2008

(54) OSCILLATOR AND SEMICONDUCTOR DEVICE

(75) Inventors: Hideo Nunokawa, Kawasaki (JP); Fukuji Kihara, Kawasaki (JP); Tomonari Morishita, Kawasaki (JP); Shunichi Ko, Kawasaki (JP); Hiroshi Ookawa, Asahi (JP)

(73) Assignees: Fujitsu Limited, Kawasaki (JP); Kyocera Kinseki Corporation, Tokyo (JP)

( * ) Notice: Subject to any disclaimer, the term of this patent is extended or adjusted under 35 U.S.C. 154(b) by 63 days.

(21) Appl. No.: 11/238,954

(22) Filed: Sep. 30, 2005

(65) Prior Publication Data

US 2006/0071725 A1    Apr. 6, 2006

(30) Foreign Application Priority Data

Oct. 1, 2004    (JP) .............................. 2004-290614

(51) Int. Cl.
*H03B 5/32* (2006.01)

(52) U.S. Cl. ............. 331/158; 331/116 FE; 331/116 R; 331/74

(58) Field of Classification Search ................. 331/158, 331/74, 116 R, 116 FE
See application file for complete search history.

(56) References Cited

U.S. PATENT DOCUMENTS 4,994,765 A  2/1991  Greene et al.
5,606,293 A  2/1997  Matsui et al.
7,088,196 B2 *  8/2006  Ashida et al. ............... 331/158

FOREIGN PATENT DOCUMENTS

| EP | 0 828 347 | 3/1998 |
|---|---|---|
| JP | 6-338751 | 12/1994 |
| JP | 10-004347 | 1/1998 |

OTHER PUBLICATIONS

European Search Report dated Dec. 19, 2005 for related European Patent Application No. 05256138.8-2215.

* cited by examiner

*Primary Examiner*—Arnold Kinkead
(74) *Attorney, Agent, or Firm*—Staas & Halsey LLP

(57) ABSTRACT

An object is not only to contribute to reduction in current consumption but also to advance actuation of a system required in a camera, an on-vehicle electric component, etc. by shortening a waiting time for stabilization of oscillation. An oscillator having an inverting amplifier inverting and amplifying an input signal and outputting it, a resonator connected to between an input and an output terminals of the inverting amplifier, a feedback resistance connected in parallel to the resonator, and an output circuit outputting a first clock signal based on a signal of an on-load parallel resonance frequency or a parallel resonance frequency oscillated by the resonator, the inverting amplifier and the feedback resistance to a function block is provided.

25 Claims, 11 Drawing Sheets

OSCILLATOR AND SEMICONDUCTOR DEVICE

CROSS-REFERENCE TO RELATED APPLICATIONS

This application is based upon and claims the benefit of priority from the prior Japanese Patent Application No. 2004-290614, filed on Oct. 1, 2004, the entire contents of which are incorporated herein by reference.

BACKGROUND OF THE INVENTION

1. Field of the Invention

The present invention relates to an oscillator and a semiconductor device.

2. Description of the Related Art

In recent years, reduction in power consumption is required in products made with ecological sensitivity or electronic devices such as portable devices. With this, reduction in current consumption is required of each of the elements (an oscillator and a semiconductor device) which control these electronic devices. This requirement also needs reduction in power consumption in a system operation, and how small the current consumption in the standby state is made leads to product differentiation in the system. For this purpose, it is necessary to decrease waiting time for stabilization of oscillation of a system clock (oscillator), which becomes always necessary, as much as possible and to perform a constant process (count of a clock and the like) early, in the state transition to the normal operation state from the above described standby state. Attention is paid to a method for decreasing average current consumption by transition to the standby state.

Besides, Japanese Patent Application Laid-open No. 6-338751 discloses a crystal resonator which shortens rise time by decreasing overshoot of oscillation frequency at a time of rise of the oscillator.

SUMMARY OF THE INVENTION

An object of the present invention is not only to contribute to reduction in current consumption but also to quicken activation of a system required in a camera, on-vehicle electrical components or the like by shortening waiting time for stabilization of oscillation.

According to one aspect of the present invention, an oscillator having an inverting amplifier that inverts and amplifies an input signal and outputs it, a resonator connected between an input and an output terminals of the inverting amplifier, a feedback resistance connected in parallel to the resonator, and an output circuit that is connected to the resonator, and outputs a first clock signal based on a signal of an on-load parallel resonance frequency or a parallel resonance frequency oscillated by the resonator, the inverting amplifier and the feedback resistance to a function block is provided.

DETAILED DESCRIPTION OF THE PREFERRED EMBODIMENTS

Principle of Embodiment

Figures 3A, 3B:
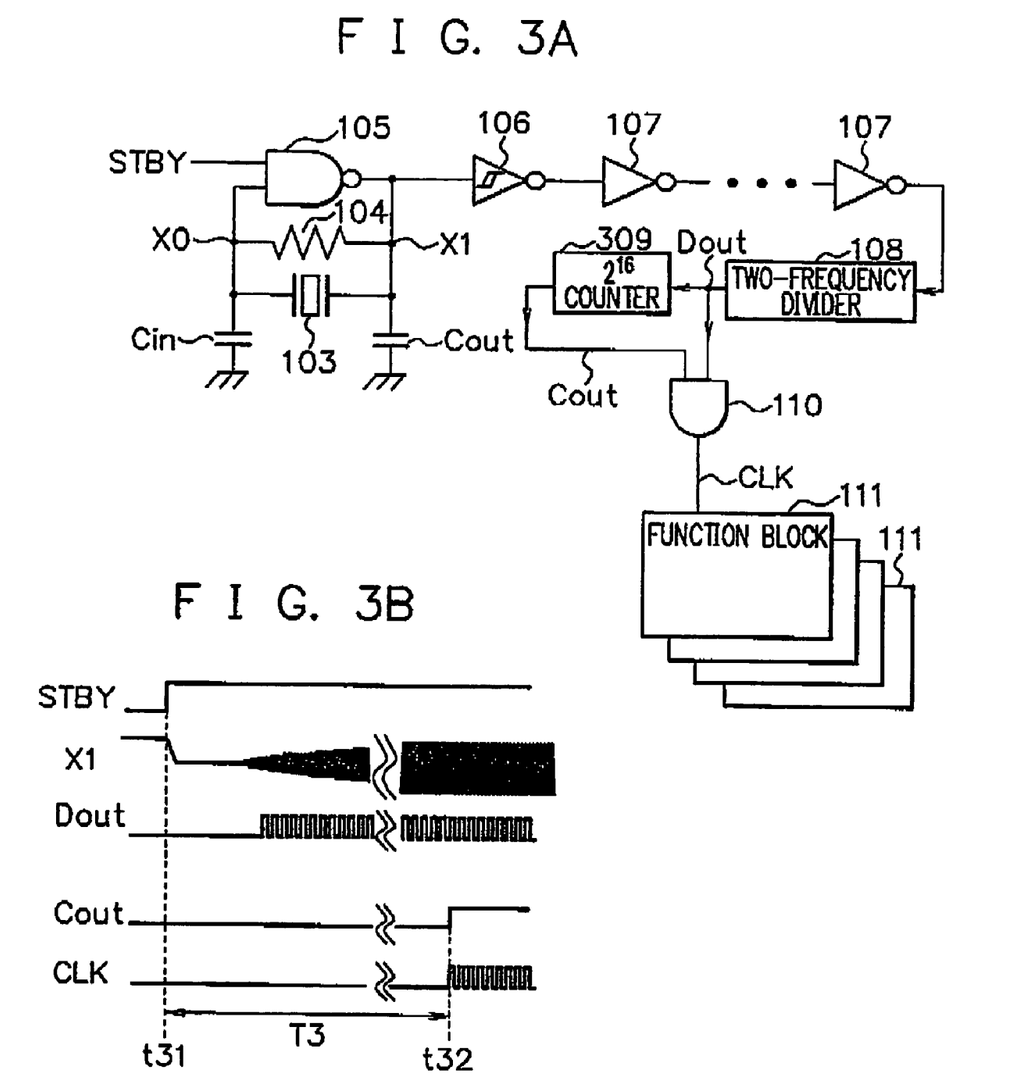
FIG. 3A is a circuit diagram showing a configuration example of a semiconductor device including an oscillator and a function block.
FIG. 3B is a timing chart for explaining its operation.

FIG. 3A is a circuit diagram showing a configuration example of a semiconductor device including an oscillator and a function block 111, and FIG. 3B is a timing chart for explaining the operation.

In FIG. 3A, a negative logical product (NAND) circuit 105 outputs a NAND signal of a standby signal STBY and an input signal X0 as an output signal X1. The standby signal STBY is a signal for stopping oscillation of an oscillator, and the standby signal release oscillation stop at a high level. When the standby signal STBY is at a low level, the output signal X1 is always at a high level, and oscillation stops. When the standby signal STBY is at a high level, the NAND circuit (inverting amplifier) 105 functions as an inverter, and inverts and amplifies the input signal X0 and outputs the output signal X1. A resonator 103 is connected between an input and an output terminals of the NAND circuit 105. A feedback resistance 104 is connected between the input and output terminals of the NAND circuit 105 in parallel with the resonator 103. Capacitances Cin and Cout respectively exist between both ends of the resonator 103 and a reference potential (ground).

In the above construction, the above described feedback resistance 104 is generally formed in ah semiconductor device (LSI chip) including the NAND circuit 105 by a semiconductor element manufacturing process, but it is selected as necessary for the feedback resistance 104 to be connected to an external connection terminal of the semiconductor device as an individual fixed or semi-fixed resistor (so-called exterior resistance). A feedback resistance element formed inside the semiconductor device and a feedback resistance element connected to an external connection terminal may be used in combination.

Meanwhile, the above described oscillator 103 is generally connected to an external connection terminal of the above described semiconductor device (LSI chip), but it is selected as necessary for the oscillator 103 to be housed and sealed in an exterior sealer (mold resin or ceramics container or the like) of the LSI chip with the LSI chip.

Hereinafter, the above described construction is called an oscillation circuit for convenience. Namely, the oscillation circuit includes the NAND circuit 105, the feedback resistance 104, the resonator 103 and the capacitances Cin and Cout. A positive feedback loop is formed by the oscillation circuit to perform an oscillation operation. An output circuit is constituted of a Schmitt inverter 106, an inverter 107, a two-frequency divider 108, a counter 309 and a logical product (AND) circuit 110. The oscillator is constituted of the above described oscillation circuit and output circuit.

An input terminal of the Schmitt inverter 106 is connected to an output terminal of the NAND circuit 105. The Schmitt inverter 106 is an inverter having characteristics that input voltage and output voltage draw a hysteresis loop, and threshold voltage when the input voltage rises and threshold voltage when the input voltage lowers are different. When a noise is included near the threshold voltage of the input voltage, if an inverter without hysteresis is used, chattering in which excessive pulse appears in output occurs. The Schmitt inverter 106 has the hysteresis characteristics, and therefore, it can obtain a rectangular wave without chattering and can output a stable oscillation signal.

An output terminal of the Schmitt inverter 106 is connected to the two-frequency divider 108 via a plurality of inverters 107. The inverters 106 and 107 can invert and amplify the oscillated signals. The two-frequency divider 108 frequency-divides the oscillated signal into two, and outputs a signal Dout of which cycle is doubled. The counter 309 counts $2^{16}$ of pulses of the signal Dout, and when overflow occurs, the counter 309 brings an output signal Cout to a high level. Namely, the signal Cout is at a low level before counting $2^{16}$, and is at a high level after counting $2^{16}$. The logical product (AND) circuit 110 outputs an AND signal of the signal Cout and the signal Dout as a clock signal CLK to a plurality of function blocks 111. When the signal Cout is at a low level, the clock signal CLK keeps at a low level. When the signal Cout is at a high level, the clock signal CLK becomes the same as the signal Dout. The counter 309 and the AND circuit 110 allow the oscillation signal Dout to the function blocks 111 as the clock signal CLK after counting $2^{16}$ of the oscillated signals Dout. The function block 111 is, for example, a memory or a logical circuit and is operated when the clock signal CLK is inputted.

In FIG. 3B, before a time t31, the standby signal STBY is at a low level, and shows a standby state. At the time t31, the standby signal STBY is changed to a high level from the low level, and thereby, the oscillator can be shifted to a normal operation state from the standby state. Thereby, oscillation is started, and amplitude of an oscillation signal X1 gradually becomes large. When the amplitude of the oscillation signal X1 exceeds the threshold voltage of the Schmitt type inverter 106, a pulse appears at the signal Dout. When the number of pulses of the signal Dout becomes $2^{16}$ or larger, the overflow signal Cout shifts to a high level from a low level at a time t32, and a pulse appears at the clock signal CLK. A time T3 from a standby releasing time t31 to a clock signal output starting time t32 is waiting time for stabilization of oscillation.

The above described operation is the same at the time of actuation by turning on power. The actuation time T3 of the oscillator expresses a time from the time when electric supply to the oscillator is started by turning on the power until the amplitude of the output clock signal CLK of the oscillator reaches a stationary value. The oscillation signal X1 before the amplitude of the output clock signal CLK reaches the stationary value cannot be utilized.

At the time of starting oscillation by turning on the power and release of standby, the amplitude of the oscillation signal X1 of the resonator 103 gradually becomes large. After estimating the time until the oscillation amplitude becomes sufficient, and waiting until the time passes with the counter 309 for a fixed time (cannot operated as the system and in the waiting state), the oscillator supplies the clock signal CLK to the function block 111 and causes the operation of the function block 111 to start.

Since the waiting time T3 for stabilization of oscillation of the resonator 103 is long (for example, when the resonator 103 of 4 MHz is used, time of about 30 ms), there is the problem that the resonator cannot be used for the purpose of a system which has to be actuated early and perform processing at the time of turning on the power or at the time of releasing standby.

Besides, in a system which carries out ultra low power consumption by shortening the time of power consumption by being operated for only necessary time by an intermittent operation and suspended after performing predetermined process, there is also the problem of wastefully consuming power with the operation of the frequency divider 108, the counter 309 and the like. In terms of the system, the waiting time T3 for stabilization of oscillation is the time in which the system cannot operate and is made to wait, and the consumption current of the system also passes during this time. Therefore, the waiting time has a very large influence on the average current consumption of the entire system.

Since a change in the frequency of a signal which the resonator 103 outputs at the time of actuation is unclear in an oscillator and its application products, waiting time has to be set more or less even after the amplitude of the oscillation signal X1 reaches the normal value in all the application devices utilizing the oscillation frequency of the resonator 103. Accordingly, this causes the factor that increases the time taken before the operation of the application components and application devices themselves which utilize the output power of the oscillator is started.

In the embodiment of the present invention, the oscillation characteristics immediately after turning on the power of the oscillator using the resonator or immediately after releasing standby are clarified, and the oscillation output power in an area (time) before the oscillator reaches the steady state (100% of output amplitude) which is not used conventionally, is supplied to the function block 111 as a clock signal to operate the function block 111, whereby the actuation time T3 of the function block 111 is shortened.

Figure 4:
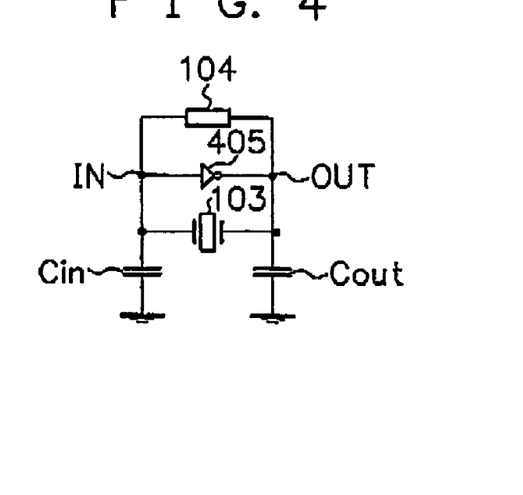
FIG. 4 is an equivalent circuit diagram of an inverter type oscillation circuit.

FIG. 4 is an equivalent circuit diagram of the inverter type oscillation circuit in FIG. 3A. An inverter 405 corresponds to the NAND circuit 105 at the time of the standby signal STBY in FIG. 3A at a high level, and has an input terminal IN and an output terminal OUT.

Figure 5:
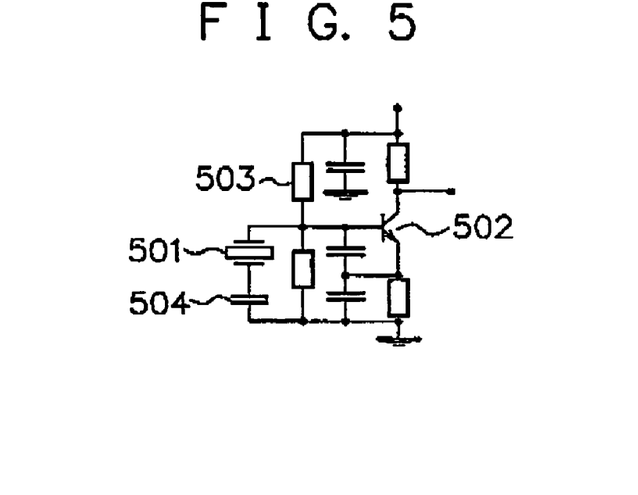
FIG. 5 is a circuit diagram showing a configuration example of a transistor type oscillation circuit.

FIG. 5 is a circuit diagram showing a configuration example of a transistor type oscillation circuit. The oscillation circuit is constructed by using a resonator 501, an npn type bipolar transistor 502, a resistance 503 and a capacitor 504, and performs the same oscillation as the oscillation circuit in FIG. 4.

Figure 6:
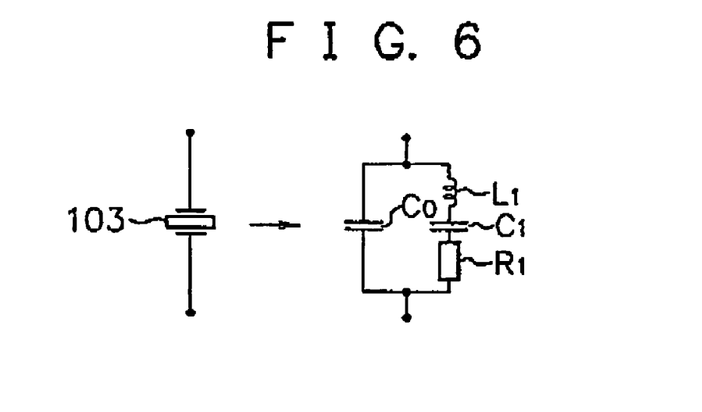
FIG. 6 is a diagram showing a symbol of a resonator and its electric equivalent circuit.

FIG. 6 is a diagram showing a symbol of the resonator 103 and its electric equivalent circuit. The resonator 103 is equivalent to a circuit in which a capacitance $C_0$ is connected in parallel to series connection of an inductor (coil) $L_1$, a capacitance $C_1$ and resistance $R_1$.

Figure 7:
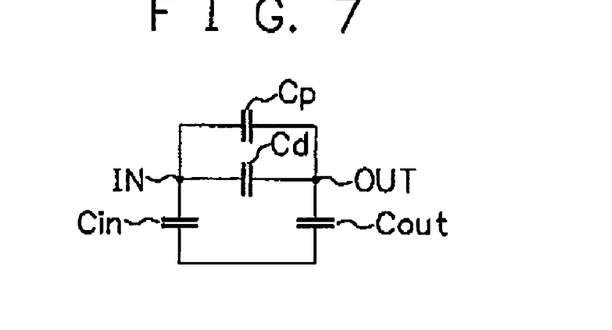
FIG. 7 is a circuit diagram showing a load capacitance of the inverter type oscillation circuit.

FIG. 7 is a circuit diagram showing a load capacitance $C_L$ of the inverter type oscillation circuit in FIG. 4. The load capacitance $C_L$ is a reactance component having an influence on oscillation frequency in an actual circuit board, and is obtained from the following expression. A capacitance Cd is a capacitance between the terminals IN and OUT. A capacitance Cp is a stray capacitance which the circuit board or the like has.

$$C_L=(Cin \times Count)/(Cin+Cout)+Cp+Cd$$

Figure 8:
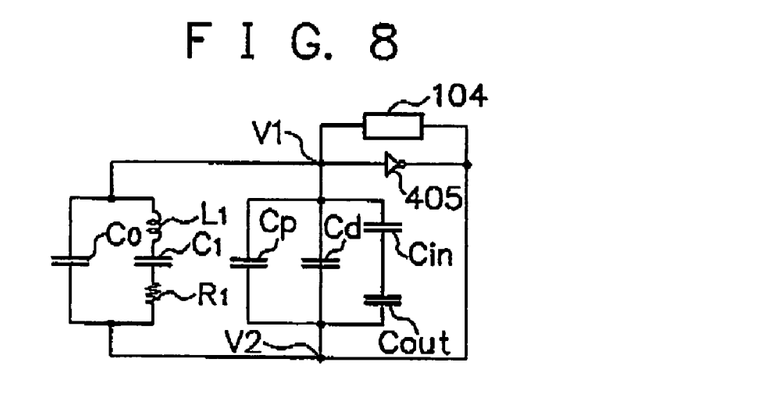
FIG. 8 is an equivalent circuit diagram of an oscillation circuit.

FIG. 8 is an equivalent circuit diagram of the oscillation circuit in FIG. 4 including the resonator 103 in FIG. 6 and the load capacitance $C_L$ in FIG. 7. The load capacitance $C_L$ is connected in parallel to the resonator 103. This corresponds to FIG. 11C, and oscillates at an on-load parallel resonance frequency $f_{La}$. The oscillation frequency of the resonator 103 is determined in accordance with the value of the load capacitance $C_L$.

Figure 9:
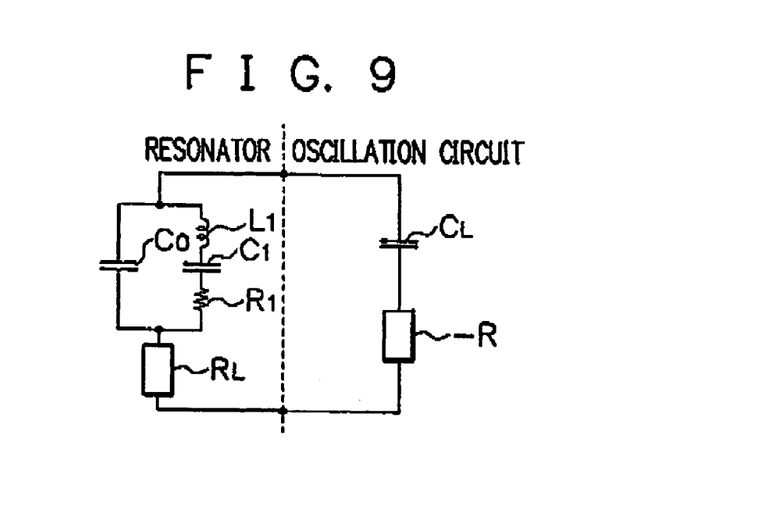
FIG. 9 is an equivalent circuit of the oscillation circuit at a time of steady-state oscillation.

FIG. 9 is an equivalent circuit diagram of the oscillation circuit at the time of steady-state oscillation. An on-load resonance resistance $R_L$ of the resonator 103 and a negative resistance $-R$ of the oscillation circuit are added. The load capacitance $C_L$ is connected in series to the resonator 103. This corresponds to FIG. 11B which will be described later, and oscillates at an on-load series resonance frequency $f_{Lr}$.

Figure 10:
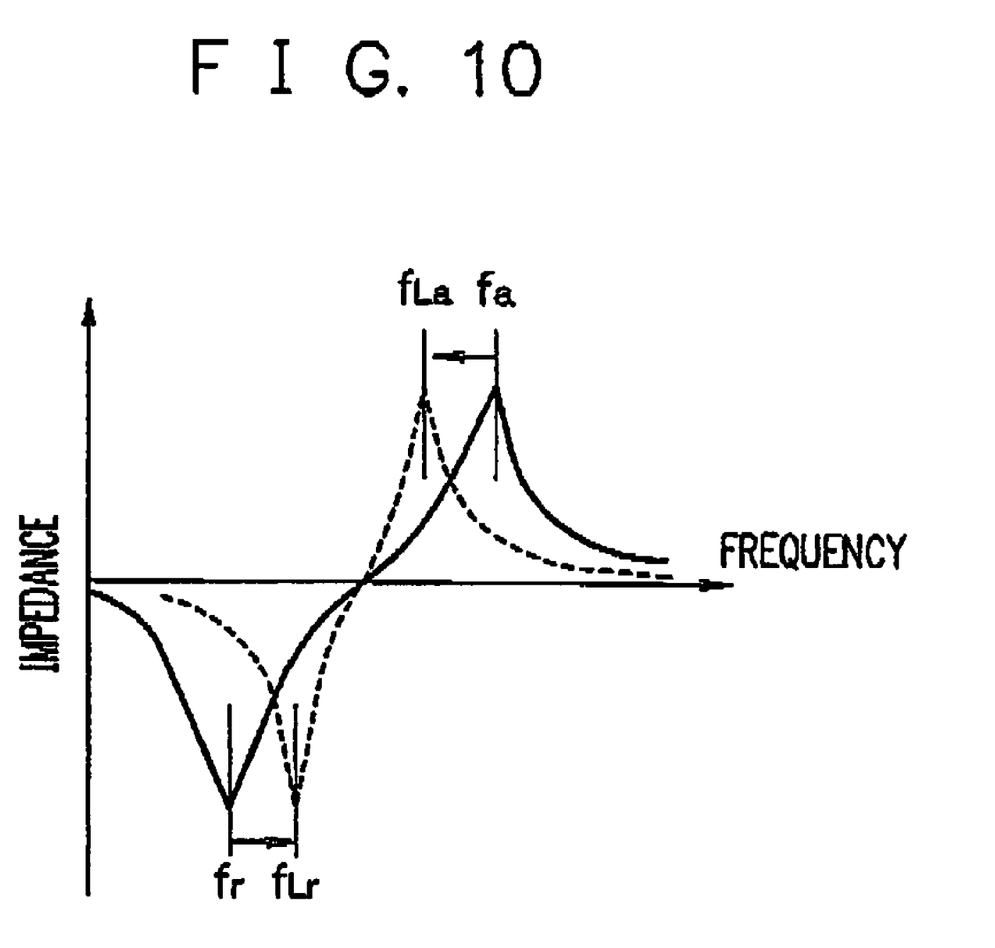
FIG. 10 is a diagram showing a frequency variation in the vicinity of resonance points by the load capacitance.

FIG. 10 is a diagram showing a frequency change in the vicinity of resonance points by the load capacitance $C_L$. The horizontal axis represents frequency and the vertical axis represents impedance. The characteristics of the resonator changes in accordance with the load capacitance value of the oscillator. The IEC publication 60122-2 or JIS standard C 6701 describes a series resonance frequency $f_r$ and a parallel resonance frequency $f_a$ change to the on-load resonance frequencies $f_L$ when the load capacitance $C_L$ is connected in parallel to the resonator 103 and when the load capacitance $C_L$ is connected in series to the resonator 103, and the on-load resonance frequencies of both of them are expressed as $f_L$. In this specification, in order to avoid confusion, the frequency resulting from the series resonance frequency $f_r$ uniquely changing by the load capacitance $C_L$ is expressed as the on-load series resonance frequency $f_{Lr}$, and the frequency resulting from the parallel resonance frequency $f_a$ changing by the load capacitance $C_L$ is expressed as the on-load parallel resonance frequency $f_{La}$.

Figure 11A:
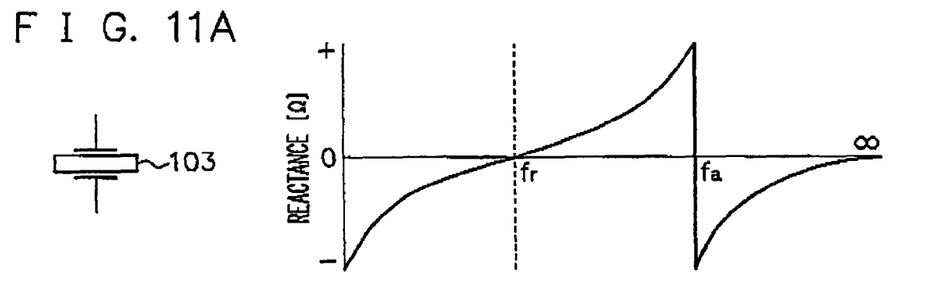
FIGS. 11A to 11C show diagrams showing resonance frequencies of the resonator.
Figure 11B:
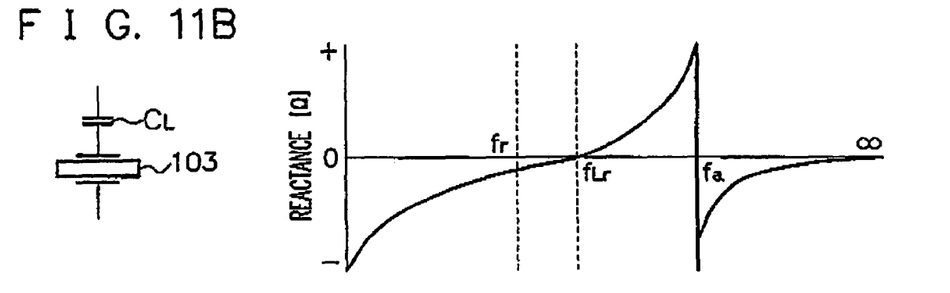
Figure 11C:
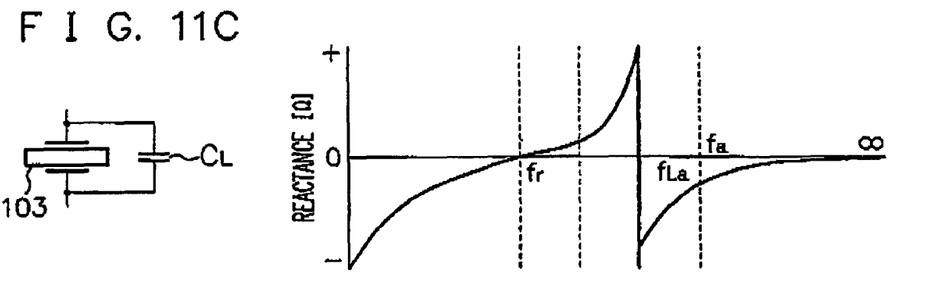

FIGS. 11A to 11C are diagrams showing frequency change in the vicinity of resonance points by the load capacitance $C_L$ shown in FIG. 10 more specifically.

FIG. 11A shows the series resonance frequency $f_r$ and the parallel resonance frequency $f_a$ of the resonator 103 without the load capacitance $C_L$. The series resonance frequency $f_r$ is a lower frequency out of two frequencies at which the electric impedance of the resonator alone becomes resistive under a specified condition. On the other hand, the parallel resonance frequency $f_a$ is a higher frequency out of the two frequencies at which the electric impedance of the resonator alone becomes resistive under the specified condition.

FIG. 11B shows the on-load series resonance frequency $f_{Lr}$ when the load capacitance $C_L$ is connected in series to the resonator 103. The on-load series resonance frequency $f_{Lr}$ is a lower frequency out of two frequencies at which the electric impedance becomes resistive when the load capacitance $C_L$ is connected in series to the resonator 103 under the specified condition. The resonance frequency changes from $f_r$ to $f_{Lr}$ by connecting the load capacitance $C_L$ in series to the resonator 103.

In the oscillation circuit at the time of steady-state oscillation shown in the above described FIG. 9, the resonator oscillates at the on-load series resonance frequency $f_{Lr}$.

FIG. 11C shows the on-load parallel resonance frequency $f_{La}$ when the load capacitance $C_L$ is connected in parallel to the resonator 103. The on-load parallel resonance frequency $f_{La}$ is a higher frequency out of two frequencies at which the electric impedance becomes resistive when the load capacitance $C_L$ is connected in parallel to the resonator 103 under a specified condition. The resonance frequency changes to $f_{La}$ from $f_a$ by connecting the load capacitance $C_L$ in parallel to the resonator 103. The on-load parallel resonance frequency $f_{La}$ is higher than the on-load series resonance frequency $f_{Lr}$.

In the inverter type oscillation circuit shown in the above described FIG. 4, the load capacitance $C_L$ is connected in parallel to the resonator 103, and the resonator 103 oscillates at the on-load parallel resonance frequency $f_{La}$. The oscillation frequency of the resonator 103 is determined by the value of the load capacitance $C_L$.

Un the oscillation circuit in which the resonator 103 and the inverting amplifier 405 are combined, as the actuation condition for actuating the resonator 103, the oscillation circuit is designed so that "potential difference of a direct-current voltage is transiently applied between the electrodes of the resonator 103 at the time of turning on power". For example in the equivalent circuit shown in FIG. 8, the load capacitance $C_L$ is connected in parallel to the capacitance $C_0$, and when direct-current voltage is applied to them by turning on the power of the oscillation circuit, these reactance components are charged by a potential difference $\Delta V$ between a potential V1 of the input terminal IN and a potential V2 of the output terminal OUT. The electric charges which are charged in them are discharged through an inductor $L_1$ and a resistance $R_1$. At this time, a resonance frequency $F_{osc}$ by the resultant capacitance of the capacitances $C_L$, $C_0$ and $C_1$ and the inductor $L_1$ occurs. The frequency $F_{osc}$ is calculated by the following expression.

$$F_{osc}=1/(2\pi \sqrt{(L_1(C_L+C_0) \times C_1)/(C_L+C+C_1)})=f_{La}$$

In the equivalent circuit shown in FIG. 8, the oscillation frequency $F_{osc}$ at the time of actuation is the on-load parallel resonance frequency $f_{La}$ in FIG. 10, and is located between the on-load series resonance frequency $f_{Lr}$ and the parallel resonance frequency $f_a$. The amplitude of the oscillation frequency $f_{La}$ which occurs here is a very small value at the early stage of oscillation, but the electric charges consumed at the resistance $R_1$ is made up for by the inverting amplifier 405, and therefore, the amplitude gradually becomes large as shown in FIG. 12A to be a steady-state amplitude soon.

FIG. 9 is an equivalent circuit of an oscillation circuit in a steady state, and the load capacitance $C_L$ is an element that determines the on-load series resonance frequency $f_{Lr}$ that is the oscillation frequency $F_{osc}$ in the steady state as the following expression.

$$F_{osc}=f_r(C_1/(2(C_0+C_L))+1)=f_{Lr}$$

Figure 12A:
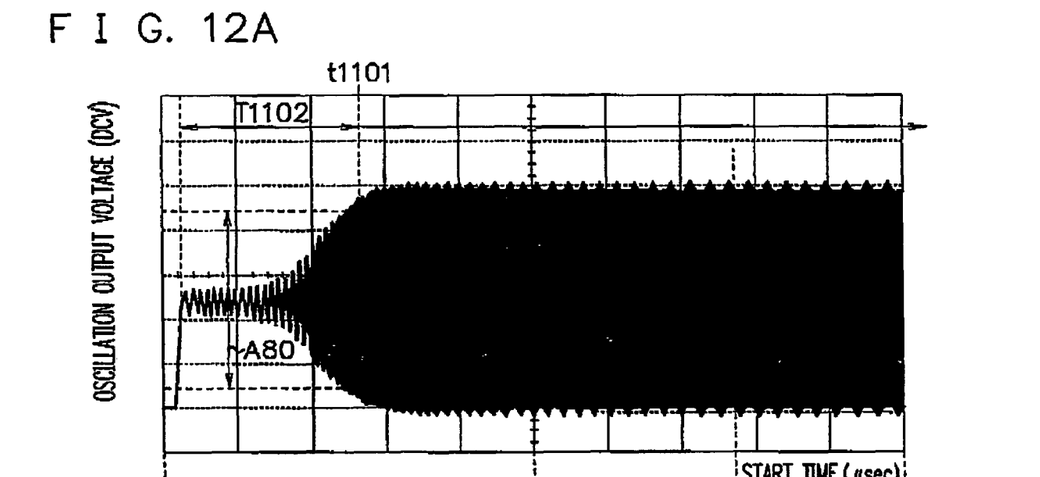
FIG. 12A is a waveform diagram of an actual measurement result expressing a change in oscillation output voltage after power is turned on in the oscillation circuit.

FIG. 12A is a waveform diagram showing a change in oscillation output voltage after power is turned on in an oscillation circuit using the resonator 103 of oscillation frequency (on-load series resonance frequency) of 16 MHz in the steady oscillation state, and is an example in which the horizontal axis represents time after the power is turned on, and the vertical axis represents the oscillation output voltage. The oscillation frequency is generally unstable during a time period T1102 from the start of supply of electricity to an oscillation circuit to a time t1101 at which the oscillation output voltage reaches an amplitude A80 that is 80% of the steady-state amplitude.

Figure 12B:
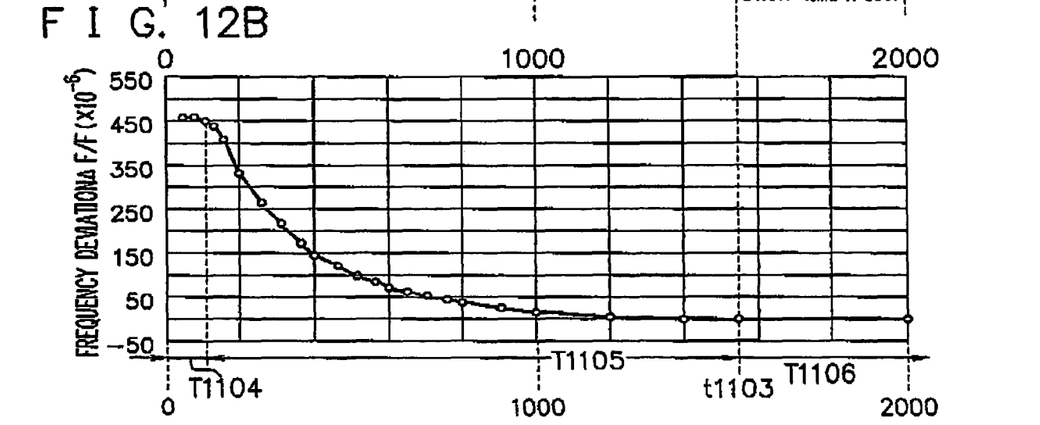
FIG. 12B is a diagram expressing an example of an actual measurement result of frequency oscillation starting characteristics.

FIG. 12B is an example of frequency oscillation start characteristics in which the horizontal axis represents a start time common in scale to FIG. 12A and the vertical axis represents the frequency deviation. FIG. 12B is the result of measuring the same oscillation output as in FIG. 12A at the same time, and shows that in the area from the time t1101 onward, the change in the frequency continues until a time t1103 at which the oscillation amplitude level is completely stabilized.

Immediately after the start of oscillation, the area where the frequency becomes the highest as in a time period T1104 is the area in which oscillation is made at the on-load parallel resonance frequency $f_{La}$. In a time period T1106 from the time t1103 onward, the area in which oscillation is made at the oscillation frequency of the on-load series resonance frequency $f_{Lr}$ is established, and the area is in the steady oscillation state at a constant frequency. A time period T1105 is a transition period between the periods T1104 and T116, and is the area in which the oscillation frequency continuously shifts to the on-load series resonance frequency $f_{Lr}$ from the on-load parallel resonance frequency $f_{La}$.

Figure 13A:
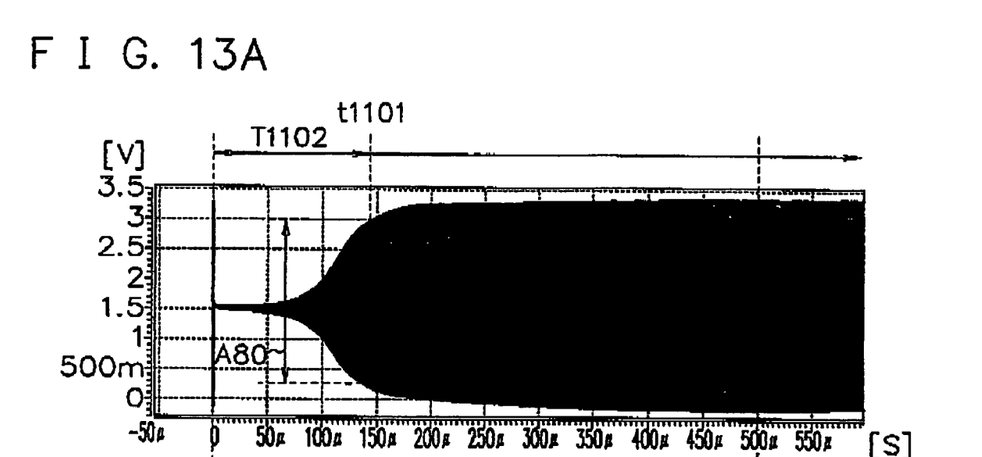
FIG. 13A is a waveform diagram of a simulation result expressing a change in oscillation output voltage after the power is turned on in the oscillation circuit.
Figure 13B:
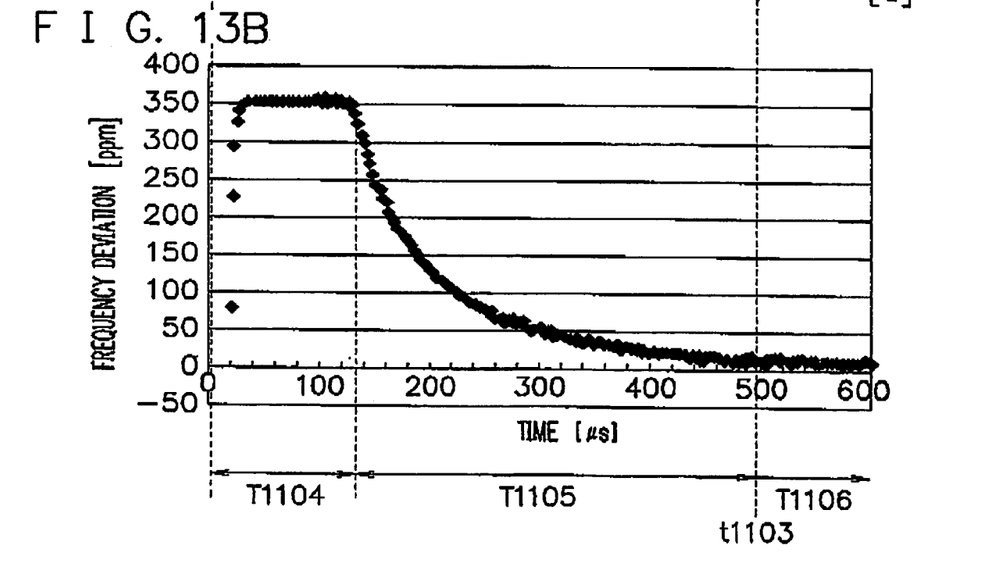
FIG. 13B is a diagram expressing a simulation result of the frequency oscillation starting characteristics.

The above-described FIGS. 12A and 12B are the actual measurement results. On the other hand, FIGS. 13A and 13B are simulation results of the resonator of 16 MHz corresponding to FIGS. 12A and 12B. In the simulation results in FIGS. 13A and 13B; the same change in oscillation output voltage and frequency change as in the actual measurement results in FIGS. 12A and 12B can be confirmed.

As described above, the change in the oscillation characteristics shown at the oscillation starting time immediately after power of the oscillation circuit is turned on, or at the time of release from oscillation stop is clarified. Thereby, the inventor of the present application found that it is possible to advance the oscillation starting time by also using the small amplitude area in the range of "the time T3 before the amplitude of the output voltage of the oscillation circuit reaches the steady-state value immediately after the power is turned on" in FIG. 3B, which has not been conventionally used. Therefore, according to this embodiment, it becomes possible to use all the oscillation output which is outputted from the oscillation circuit immediately after the resonator starts oscillation as a clock source by using the above described small amplitude area, and waiting time of the device utilizing it can be substantially eliminated. Namely, the states of oscillation and frequencies in the time, periods T1104, T1105 and T1106 are clarified by the above described frequency analysis, and therefore, oscillation output can be also used as the oscillation clock signals in the time period T1104 in which oscillation is made at the on-load parallel resonance frequency $f_{La}$ and the frequency shift time period T1105, before the time period T1106 in which steady-state oscillation is made at the on-load series resonance frequency $f_{Lr}$. Therefore, the function block also starts operation by the on-load parallel resonance frequency $f_{La}$ at the oscillation starting time of resonator in the time period T1104 by supplying the oscillation output to the function block from the oscillator, and therefore, oscillation stabilization waiting time can be significantly decreased. Namely, according to the present invention, the oscillation starting time can be advanced by clarifying the characteristics which occur immediately after the power of the oscillation circuit is turned on, or at release from the oscillation stop, by supplying the oscillation clock in the area before reaching the steady state (100% of the output amplitude), which has not been conventionally used, to the function block to operate the function block.

In FIGS. 12A and 12B, the oscillation frequency is unstable in the time period T1102 before the time t1101 at which the oscillation output voltage reaches the amplitude A80 which is 80% of the steady-state amplitude. However, the state of oscillation and frequency are clarified, and therefore, the clock signal at the time when the oscillation amplitude of the resonator is less than 80% (A80) of the amplitude in the steady-state oscillation state can be outputted to the function block and used.

Figure 14A:
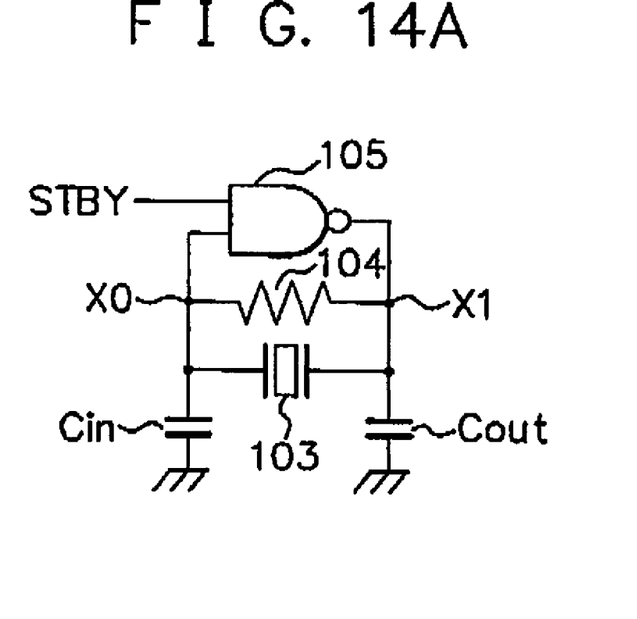
FIGS. 14A and 14B are diagrams showing the oscillation circuit and a change in oscillation frequency at a time of turning on the power.
Figure 14B:
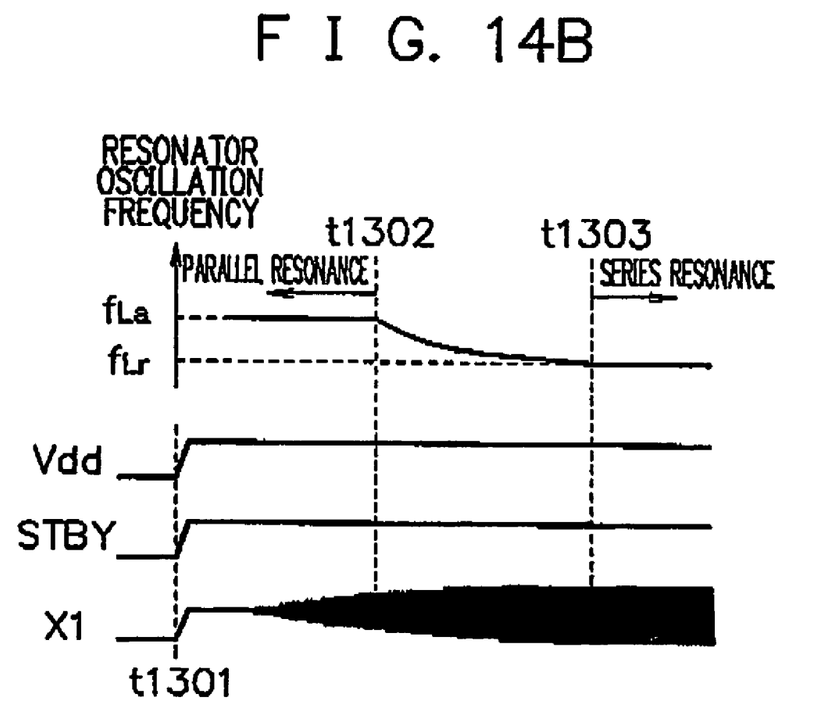

FIGS. 14A and 14B are diagrams showing an oscillation circuit and the change in the oscillation frequency at a time of turning on the power of it. Before the power is turned on, the potential at a power supply voltage Vdd, a standby signal STBY and an output terminal X1 is 0 V. When the power is turned on at a time t1301, the power supply voltage Vdd rises to a predetermined value, and the standby signal STBY reaches a high level. Soon, an oscillation signal appears at the output terminal X1. Before a time t1302, the resonator 103 oscillates at the on-load parallel resonance frequency $f_{La}$. During the time from the time t1302 to a time t1303, the resonator 103 oscillates so that the frequency changes from the on-load parallel resonance frequency $f_{La}$ to the on-load series resonance frequency $f_{Lr}$. From the time t1303 onward, the resonator 103 oscillates at the on-load series resonance frequency $f_{Lr}$.

In the area from the time t1303 onward in which the voltage amplitude of the oscillation output sufficiently stabilizes after time elapses after the start of oscillation at the time t1301 of turning on the power, the resonator oscillates at the normal oscillation frequency (on-load series resonance frequency $f_{Lr}$). However, immediately after oscillation, the resonator oscillates at the on-load parallel resonance frequency $f_{La}$ which differs from the on-load series resonance frequency $f_{Lr}$. Thereafter, the resonance frequency gradually shifts to the on-load series resonance frequency $f_{Lr}$ from the on-load parallel resonance frequency $f_{La}$, and in the shift period, an abrupt frequency change does not occur.

In the above described explanation, the case where the load capacitance $C_L$ exists as shown in FIGS. 11B and 11C is described as an example, but by connecting a coil under a predetermined condition, the load capacitance $C_L$ can be canceled out. In this case, the state as shown in FIG. 11A is established, and the resonator oscillates at the parallel resonance frequency $f_a$ before the time t1302, and oscillates at the series resonance frequency $f_r$ from the time t1303 onward. Namely, the resonator 103 oscillates at the on-load parallel resonance frequency $f_{La}$ or the parallel resonance frequency $f_a$ before the time t1302, and oscillates at the on-load series resonance frequency $f_{Lr}$ or the series resonance frequency $f_r$ after the time t1303.

As described above, the series resonance frequency $f_r$ is determined by the inductor $L_1$ and the capacitance $C_1$ in the resonator, and the parallel resonance frequency $f_a$ is the frequency peculiar to the resonator, which is determined by the parameters $C_0$, $C_1$ and $L_1$ of the resonator. The relationship $f_a > f_r$ holds good. In the frequencies which are changed by the influence of the load capacitance $C_L$, the relationship $f_{La} > f_{Lr}$ holds good.

Figure 15A:
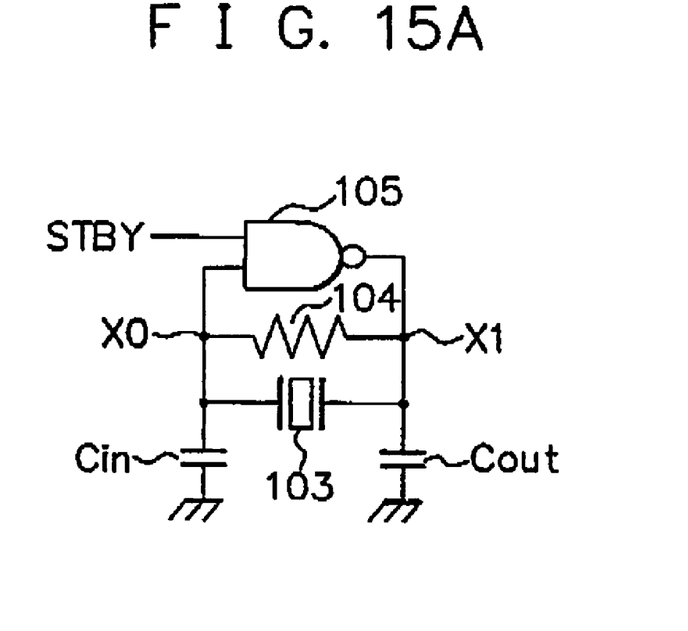
FIGS. 15A and 15B are diagrams showing the oscillation circuit and a change in the oscillation frequency at a time of release of the standby.
Figure 15B:
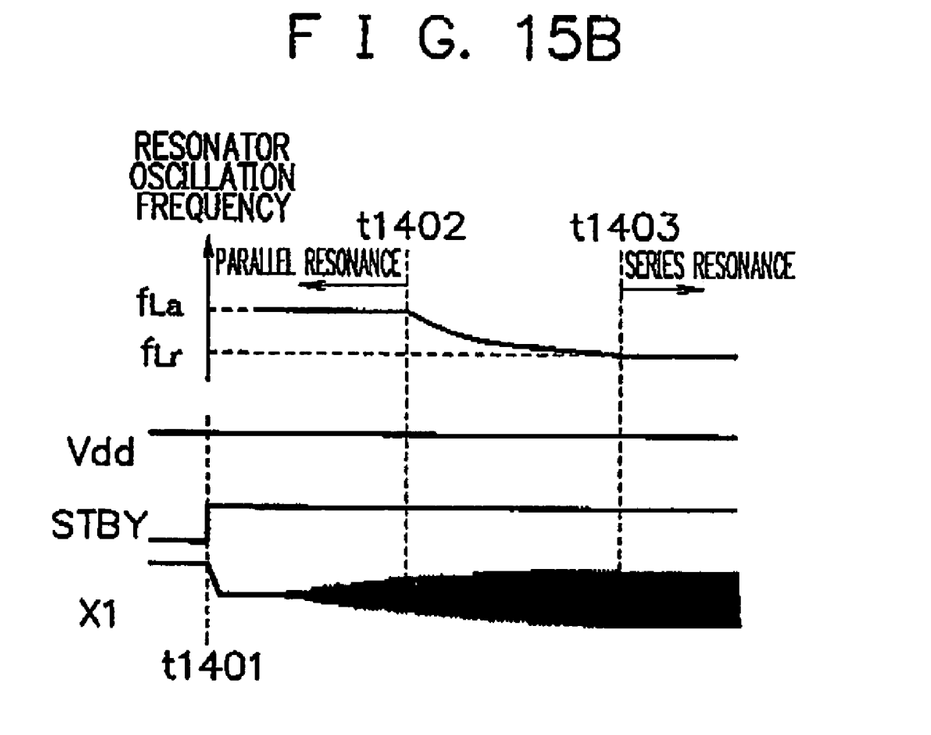

FIGS. 15A and 15B are the diagrams showing the oscillation circuit and a change in the oscillation frequency at a time of release of standby. This case is similar to the time of turning on the power in FIGS. 14A and 14B. When the standby signal STBY is lowered at a low level after the time t1303 in FIG. 14B and before a time t1401 in FIG. 15B, the standby state is established, and oscillation stops with a signal X1 kept at a high level. Thereby, power consumption can be made small.

Thereafter, when the standby signal STBY is raised to a high level at the time t1401, the standby state is released, and soon, an oscillation signal appears at the output terminal X1. Before a time t1402, the resonator 103 oscillates at the on-load parallel resonance frequency $f_{La}$ or the parallel resonance frequency $f_a$. During the time from the time t1402 to a time t1403, the resonator 103 oscillates so that the frequency changes from the on-load parallel resonance frequency $f_{La}$ or the parallel resonance frequency $f_a$ to the on-load series resonance frequency $f_{Lr}$ or the series resonance frequency $f_r$. From the time t1403 onward, the resonator 103 oscillates at the on-load series resonance frequency $f_{Lr}$ or the series resonance frequency $f_r$.

First Embodiment

Figures 1A, 1B:
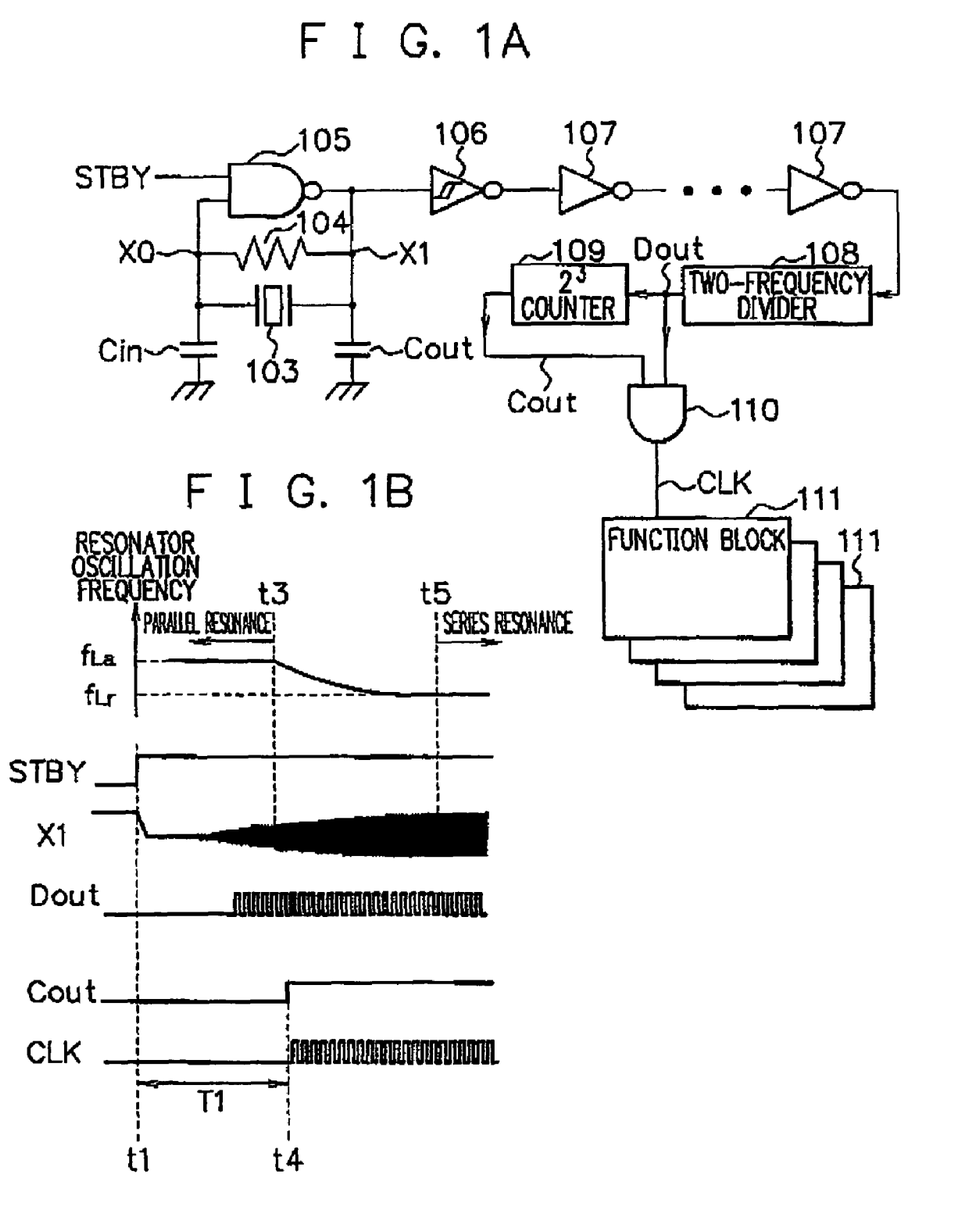
FIG. 1A is a circuit diagram showing a configuration example of a semiconductor device including an oscillator and a function block according to a first embodiment of the present invention.
FIG. 1B is a timing chart for explaining its operation.

FIG. 1A is a circuit diagram showing a configuration example of a semiconductor device including an oscillator and a function block 111 according to a first embodiment of the present invention, and FIG. 1B is a timing chart for explaining its operation.

A circuit in FIG. 1A differs from the circuit in FIG. 3A in the respect that the circuit in FIG. 1A is provided with a counter 109 of $2^3$ instead of the counter 309 of $2^{16}$, and the circuit in FIG. 1A is the same as that in FIG. 3A in the other respects. The counter 109 has the smaller number of counts than the counter 309, and raises the overflow signal Cout to a high level with the smaller number of counts. The counter 109 counts $2^3$ of pulses of the signal Dout, and when the number of pulses overflows, the counter 109 raises the output signal Cout to a high level. Namely, the signal Cout is at a low level before counting $2^3$, and after counting $2^3$, the signal Cout is at a high level. The AND circuit 110 outputs the AND signal of the signal Cout and the signal Dout to a plurality of function blocks 111 as the clock signal CLK. The counter 109 and the AND circuit 110 allow the oscillation signal Dout to be outputted to the function block 111 as the clock signal CLK after counting $2^3$ of pulses of the oscillated signal Dout.

Before a time t1, the standby signal STBY is at low level, which shows the standby state. At the time t1, by changing the standby signal STBY from a low level to a high level, the transition from the standby state to the normal operation state can be effected. This starts oscillation, and the amplitude of oscillation which appears at the output terminal X1 gradually becomes larger. Before a time t3, the resonator 103 oscillates at the on-load parallel resonance frequency $f_{La}$ or the parallel resonance frequency $f_a$. During the time from the time t3 to a time t5, the resonator 103 oscillates so that the frequency changes from the on-load parallel resonance frequency $f_{La}$ or the parallel resonance frequency $f_a$ to the on-load series resonance frequency $f_{Lr}$ or the series resonance frequency $f_r$. From the time t5 onward, the resonator 103 oscillates at the on-load series resonance frequency $f_{Lr}$ or the series resonance frequency $f_r$. During the time from the time t3 to the time t5, the frequency of the output terminal X1 is a frequency between the on-load parallel resonance frequency $f_{La}$ or the parallel resonance frequency $f_a$ and the on-load series resonance frequency $f_{Lr}$ or the series resonance frequency $f_r$.

When the amplitude at the output terminal X1 exceeds a threshold voltage of the Schmitt inverter 106, a pulse comes to appear at the signal Dout. When the number of pulses of the signal Dout becomes $2^3$ or more, the overflow signal Cout rises to a high level from a low level and a clock pulse appears at the clock signal CLK, at the time t4. The clock signal output starting time t4 is between the time t3 and the time t5. The clock signal CLK is the signal based on the resonator 103 of which frequency changes from the on-load parallel resonance frequency $f_{La}$ or the parallel resonance frequency $f_a$ to the on-load series resonance frequency $f_{Lr}$ or the series resonance frequency $f_r$ from the time t4 until the time t5, and the clock signal CLK is the signal based on the resonator 103 at the on-load series resonance frequency $f_{Lr}$ or the series resonance frequency $f_r$ from the time t5 onward. Namely, the clock signal CLK has a constant frequency after the time t5, but from the time t4 until the time t5, its frequency changes. The function block 111 is designed to perform a desired operation based on the clock signal CLK at the frequency from the time t5 onward, and to further perform a desired operation based on the clock signal CLK of the frequency which changes from the time t4 to the time t5.

A time T1 from the standby release time t1 to the clock signal output starting time t4 is an oscillation stabilization waiting time. In this embodiment, the waiting time T1 can be shortened by decreasing the number of counts of the counter 109.

In the circuit shown in FIG. 3A, the number of counts of the counter 309 is large, and it is necessary to wait sufficiently until the resonator 103 oscillates at the on-load series resonance frequency $f_{Lr}$ or the series resonance frequency $f_r$ as the clock signal output starting time t32. In the circuit in FIG. 1A according to the present invention, the number of counts of the counter 109 is small, and the clock signal output starting time t4 can be set at the frequency shift period from the time t3 to the time 5. Therefore, the waiting time T1 can be significantly shortened.

Namely, in the case of the resonator 103 of the oscillation frequency (on-load series resonance frequency) in the steady oscillation state of 4 MHz, the waiting time T3 is 32 ms in the above described circuit shown in FIG. 3A, but the waiting time T1 can be made 3 ms in the circuit shown in FIG. 1A according to the present invention, and the waiting time T3 is significantly shortened. The time from the time t1 to the time t3 is 2.998 ms. In the case of the resonator 103 of the oscillation frequency (on-load series resonance frequency) in the steady oscillation state of 16 MHz, the waiting time T3 is 4 ms in the circuit in FIG. 3A, but the waiting time T1 can be made 400 μs in the circuit in FIG. 1A according to the present invention, and the waiting time T3 is significantly shortened. The time from the time t1 to the time t3 is 399.5 μs.

In this embodiment, the function block 111 is started to operate in the transition state from the parallel resonance state before the resonator 103 is brought into the series resonance state to the series resonance state by decreasing the value of the counter 109 which waits for oscillation stabilization to $2^3$ from $2^{16}$. The point to which attention should be paid here is that $f_{La}$>$f_{Lr}$, and the frequency in the parallel resonance state is a higher frequency than the oscillation frequency (series resonance frequency) which is applied at the time of a normal operation. Namely, it is necessary for the frequencies $f_{La}$ and $f_{Lr}$ to be included in the range of the frequency of the normal operation of the function block 111 so that the function block 111 is not out of the range of the normal operation at that frequency and does not malfunction.

In the circuit shown in FIG. 1A, the counter value is set at $2^3$, but the counter value may be set at the other values as necessary. In the oscillation circuit, the NAND circuit 105 is used as the inverting amplifier, but a clocked gate circuit such as a negative logical sum (NOR) circuit can be applied instead, if the circuit functions as the inverting amplifier. The two-frequency divider 108 is provided because "the high-level time period the low-level time period" of the clock signal CLK which is given to the function block 111 is desired to be set at "1:1" even when the duty (Duty) ratio of the high level and the low level of the oscillation waveform differs, and the two-frequency divider 108 is not always necessary.

Second Embodiment

Figure 2A:
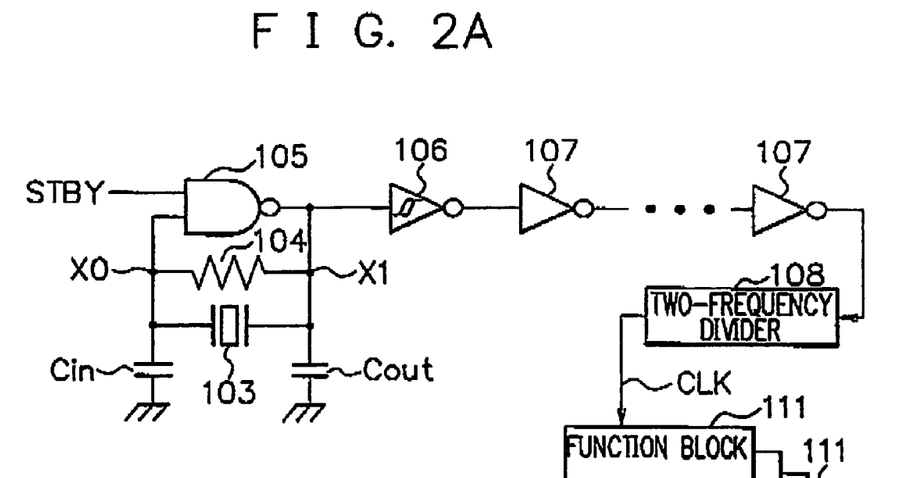
FIG. 2A is a circuit diagram showing a configuration example of a semiconductor device including an oscillator and a function block according to a second embodiment of the present invention.
Figure 2B:
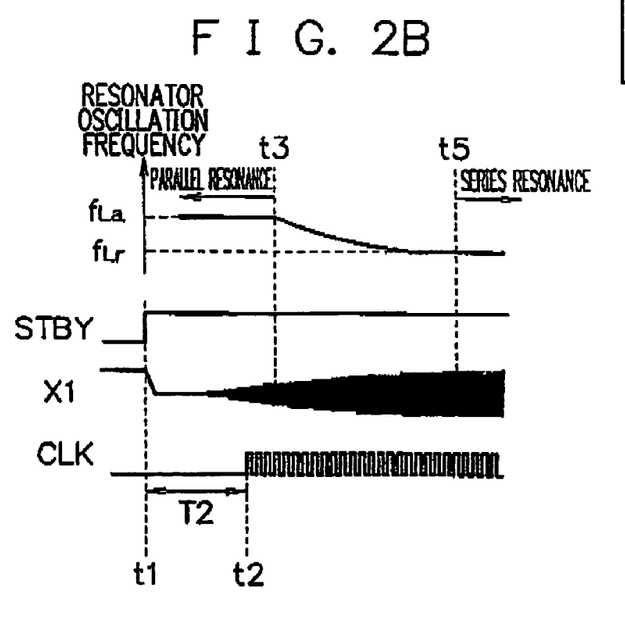
FIG. 2B is a timing chart for explaining its operation.

FIG. 2A is a circuit diagram showing a configuration example of a semiconductor device including an oscillator and the function block 111 according to a second embodiment of the present invention, and FIG. 2B is a timing chart for explaining the operation.

A circuit shown in FIG. 2A differs from the circuit shown in FIG. 3A in the respect that it does not include the counter 309 and the AND circuit 110, and the circuit shown in FIG. 2A is the same as the circuit shown in FIG. 3A in the other respects. The output signal of the two-frequency divider 108 is outputted to the function block 111 as the clock signal CLK. This embodiment is equivalent to the first embodiment shown in FIG. 1A with the number of counts of its counter 109 set at 0, and the output signal Dout of the two-frequency divider 108 directly becomes the clock signal CLK.

In the circuit shown in FIG. 2B, the part of the function which supplies the signal to the two-frequency divider 108, and its frequency are the same as in FIG. 1B, and only the clock signal CLK differs. The clock signal CLK is the same signal as the signal Dout shown in FIG. 1B.

A clock signal output starting time t2 is before the time t3. The clock signal CLK is the signal based on the resonator 103 of the on-load parallel resonance frequency $f_{La}$ or the parallel resonance frequency $f_a$ before the time t3, it is the signal based on the resonator 103 of which frequency changes from the on-load parallel resonance frequency $f_{La}$ or the parallel resonance frequency $f_a$ to the on-load series resonance frequency $f_{Lr}$ or the series resonance frequency $f_r$ from the time t3 to the time t5, and is the signal based on the resonator 103 of the on-load series resonance frequency $f_{Lr}$ or the series resonance frequency $f_r$ from the time t5 onward. Namely, the clock signal CLK changes in frequency from the time t2 onward. The function block 111 is designed to perform desired operations at all the changing frequencies of the clock signal CLK. Namely, it is suitable to design the function block 111 to perform a desired operation based on the clock signal CLK based on the resonator 103 of the on-load parallel resonance frequency $f_{La}$ or the parallel resonance frequency $f_a$ in addition to the frequencies of the first embodiment.

A time T2 from the standby release time t1 to the clock signal output starting time t2 is the oscillation stabilization waiting time. In this embodiment, the counter is not included, and thereby, the waiting time T2 can be made shorter than the waiting time T1 in the first embodiment.

In this embodiment, the counter 309 and the AND circuit 110 in the circuit shown in FIG. 3A are not included. The clock signal CLK is supplied to the function block 111 at the point of time when the voltage exceeds the threshold voltage of the Schmitt inverter (hysteresis inverter) 106 at the rear stage of the oscillation circuit is supplied to the function block 111, and therefore, the function block 111 starts an operation from the state of parallel resonance of the resonator 103. In this embodiment, the oscillation circuit does not always have to use the NAND circuit 105 and the two-frequency divider 108 is not always necessary as in the first embodiment.

FIGS. 1B and 2B, which are the timing charts for explaining the operations in the first and the second embodiments,
show the operations at the standby releasing time, and the operations at the time of turning on the power are the same as these operations.

As described above, in the first and the second embodiments, the clock signal CLK can be outputted in an extremely short time from the time of turning on the power or the standby releasing time, and the function block 111 can start the operation earlier. Thereby, the speed of response of the oscillator and the function block can be enhanced, which significantly contributes to enhancement of performance of the systems and the electronic devices of cameras, on-vehicle electric components and the like. The total operation time at the time of an intermittent operation by oscillation stop and release of it becomes short, which remarkably contributes to reduction in power consumption.

Here, as the resonator in the above described embodiments of the present invention, for example, a crystal resonator, or a ceramics resonator can be used, and various resonators which can be expressed by the same equivalent circuit as these resonators can be used.

In the oscillator and the semiconductor device according to the present embodiments, oscillation is effected at the on-load parallel resonance frequency or the parallel resonance frequency at the time of starting oscillation by turning on the power or releasing oscillation stop (standby). The waiting time until the first clock signal is outputted can be made short by outputting the first clock signal based on the signal of the on-load parallel resonance frequency or the parallel resonance frequency to the function block. Actuation of the function block can be made earlier, and response performance of the application can be enhanced. By shortening the releasing time from the oscillation stopping state, the total operation time of the oscillating operation is shortened, and lower power consumption can be realized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An oscillator, comprising:
    an inverting amplifier that inverts and amplifies an input signal;
    a resonator connected between input and output terminals of said inverting amplifier;
    a feedback resistance connected in parallel to said resonator; and
    an output circuit that is connected to said resonator, and initially outputs a first clock signal based on a signal of a frequency between an initial on-load parallel resonance frequency or an initial parallel resonance frequency oscillated by said resonator, said inverting amplifier and said feedback resistance to a function block.

2. The oscillator according to claim 1, wherein said output circuit outputs a second clock signal based on a signal of an on-load series resonance frequency or a series resonance frequency oscillated by said resonator, said inverting amplifier and said feedback resistance to the function block after outputting the first clock signal to the function block.

3. The oscillator according to claim 2, wherein said output circuit outputs a third clock signal based on a signal of which frequency changes to the on-load series resonance frequency or the series resonance frequency from the on-load parallel resonance frequency or the parallel resonance frequency oscillated by said resonator, said inverting amplifier and said feedback resistance to the function block after outputting the first clock signal and before outputting the second clock signal.

4. The oscillator according to claim 2, wherein the first clock signal is higher in frequency than the second clock signal.

5. The oscillator according to claim 1, wherein said output circuit includes an inverter that inverts and amplifies the oscillated signal.

6. The oscillator according to claim 5, wherein said output circuit includes a Schmitt inverter.

7. The oscillator according to claim 1, wherein said output circuit includes a frequency divider which frequency-divides the oscillated signal.

8. The oscillator according to claim 1, wherein said output circuit includes a counter which is for allowing the first clock signal to be outputted to the function block after counting a predetermined number of the oscillated signals.

9. The oscillator according to claim 1, further comprising capacitances respectively connected to between both ends of said resonator and reference potential.

10. The oscillator according to claim 1, wherein the first clock signal is a signal based on a signal of the on-load parallel resonance frequency or the parallel resonance frequency at an oscillation starting time by turning on power.

11. The oscillator according to claim 1, wherein the first clock signal is a signal based on a signal of the on-load parallel resonance frequency or the parallel resonance frequency at an oscillation starting time by releasing oscillation stop.

12. An oscillator, comprising:
 an inverting amplifier that inverts and amplifies an input signal;
 a resonator connected between input and output terminals of said inverting amplifier;
 a feedback resistance connected in parallel to said resonator; and
 an output circuit that is connected to said resonator and initially outputs a first clock signal based on a signal of a frequency between an initial on-load parallel resonance frequency or an initial parallel resonance frequency and an on-load series resonance frequency or a series resonance frequency oscillated by said resonator, said inverting amplifier and said feedback resistance to a function block.

13. The oscillator according to claim 12, wherein said output circuit outputs the first clock signal, at a time of an oscillation amplitude of said resonator being less than 80% of an amplitude of a steady oscillation state, to the function block.

14. The oscillator according to claim 12, wherein said output circuit outputs a second clock signal, based on a signal of an on-load series resonance frequency or a series resonance frequency oscillated by said resonator, said inverting amplifier and said feedback resistance, to the function block after outputting the first clock signal to the function block.

15. A semiconductor device comprising an oscillation circuit and a function block, wherein said oscillation circuit comprises:
 an inverting amplifier that inverts and amplifies an input signal, and
 an output circuit connected to an output terminal of the inverting amplifier, and
 the output circuit initially outputs a first clock signal based on a signal of a frequency between an initial on-load parallel resonance frequency or an initial parallel resonance frequency oscillated by a resonator connected to between an input and an output terminals of the inverting amplifier, the inverting amplifier and a feedback resistance placed between the input and the output terminals of the inverting amplifier to the function block; and
 wherein said function block performs a predetermined operation based on the first clock signal based on the oscillation signal of the on-load parallel resonance frequency or the parallel resonance frequency.

16. The semiconductor device according to claim 15, wherein:
 the output circuit outputs a second clock signal based on a signal of an on-load series resonance frequency or a series resonance frequency oscillated by the resonator, the inverting amplifier and the feedback resistance to said function block after outputting the first clock signal to said function block; and
 said function block performs a predetermined operation based on the first clock signal based on the oscillation signal of the on-load parallel resonance frequency or the parallel resonance frequency and the second clock signal based on the oscillation signal of the on-load series resonance frequency or the series resonance frequency.

17. The semiconductor device according to claim 16, wherein:
 the output circuit outputs a third clock signal based on a signal of which frequency changes to the on-load series resonance frequency or the series resonance frequency from the on-load parallel resonance frequency or the parallel resonance frequency oscillated by the resonator, the inverting amplifier and the feedback resistance to said function block after outputting the first clock signal and before outputting the second clock signal; and
 said function block performs a predetermined operation based on the third clock signal of which frequency changes.

18. The semiconductor device according to claim 16, wherein the first clock signal is higher in frequency than the second clock signal.

19. The semiconductor device according to claim 15, wherein the feedback resistance is provided inside said oscillation circuit.

20. The semiconductor device according to claim 15, wherein the feedback resistance and the resonator are provided inside said oscillation circuit.

21. A semiconductor device comprising an oscillation circuit and a function block, wherein:
 said oscillation circuit comprises:
 an inverting amplifier that inverts and amplifies an input signal, and
 an output circuit connected to an output terminal of the inverting amplifier, the output circuit initially outputting a first clock signal based on a signal of a frequency between an initial on-load parallel resonance frequency or an initial parallel resonance frequency and an on-load series resonance frequency or a series resonance frequency oscillated by a resonator connected between input and output terminals of the inverting amplifier, the inverting amplifier and a feedback resistance connected between the input and the output terminals of the inverting amplifier to the function block; and
 said function block performs a predetermined operation based on the first clock signal.

22. The semiconductor device according to claim 21, wherein the output circuit outputs the first clock signal at a time of an oscillation amplitude of the resonator being less than 80% of an amplitude of a steady oscillation state to said function block.

23. The semiconductor device according to claim 21, wherein:
- the output circuit outputs a second clock signal based on a signal of the on-load series resonance frequency or the series resonance frequency oscillated by the resonator, the inverting amplifier and the feedback resistance to said function block after outputting the first clock signal to said function block; and
- said function block performs a predetermined operation based on the second clock signal based on the oscillation signal of the on-load series resonance frequency or the series resonance frequency.

24. The semiconductor device according to claim 21, wherein the feedback resistance is provided inside said oscillation circuit.

25. The semiconductor device according to claim 21, wherein the feedback resistance and the resonator are provided inside said oscillation circuit.

* * * * *